US012733156B2

(12) United States Patent
Chae et al.

(10) Patent No.: US 12,733,156 B2
(45) Date of Patent: Sep. 8, 2026

(54) SEMICONDUCTOR DEVICES AND METHODS OF MANUFACTURING THE SAME

(71) Applicant: SAMSUNG ELECTRONICS CO., LTD., Suwon-si (KR)

(72) Inventors: Heejae Chae, Suwon-si (KR); Taejin Park, Suwon-si (KR); Hyunjin Lee, Suwon-si (KR); Hosang Lee, Suwon-si (KR); Yun Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 273 days.

(21) Appl. No.: 18/435,231

(22) Filed: Feb. 7, 2024

(65) Prior Publication Data

US 2024/0284662 A1 Aug. 22, 2024

(30) Foreign Application Priority Data

Feb. 22, 2023 (KR) ........................ 10-2023-0023788

(51) Int. Cl.

| | |
|---|---|
| ***H10B 12/00*** | (2023.01) |
| ***H10D 64/66*** | (2025.01) |
| ***H10W 10/00*** | (2026.01) |
| ***H10W 10/17*** | (2026.01) |

(52) U.S. Cl.
CPC ......... *H10B 12/488* (2023.02); *H10D 64/661* (2025.01); *H10W 10/0145* (2026.01); *H10W 10/17* (2026.01); *H10B 12/34* (2023.02)

(58) Field of Classification Search
CPC .... H10B 12/488; H10B 12/34; H10B 12/053; H10B 12/03; H10B 12/31; H10D 64/661; H10W 10/0145; H10W 10/17
See application file for complete search history.

(56) References Cited

U.S. PATENT DOCUMENTS

| | | | | |
|---|---|---|---|---|
| 7,125,774 | B2 | 10/2006 | Kim et al. | |
| 9,431,496 | B2 * | 8/2016 | Kang | H10D 64/513 |
| 9,704,988 | B2 * | 7/2017 | Oh | H10D 30/025 |
| 9,972,627 | B2 | 5/2018 | Jang et al. | |
| 11,239,118 | B2 * | 2/2022 | Kim | H10D 64/513 |
| 11,380,761 | B2 | 7/2022 | Ryu | |

FOREIGN PATENT DOCUMENTS

| | | |
|---|---|---|
| KR | 10-2015-0080714 A | 7/2015 |
| KR | 10-2022-0033587 A | 3/2022 |

* cited by examiner

*Primary Examiner* — Allison Bernstein
(74) *Attorney, Agent, or Firm* — Wolf, Greenfield & Sacks, P.C.

(57) ABSTRACT

A semiconductor device includes a substrate including a word line trench extending in a first horizontal direction; a gate dielectric layer in the word line trench; a word line extending in the first horizontal direction and in a lower portion of the word line trench on the gate dielectric layer; an insulation capping layer extending in an upper portion of the word line trench on the word line; and a plurality of gate electrodes on the substrate, wherein the word line comprises: a word line lower region extending in the first horizontal direction and including a first gate electrode of the plurality of gate electrodes on the gate dielectric layer; and a word line upper region extending in the first horizontal direction on the word line lower region and including a plurality of second gate electrodes of the plurality of gate electrodes and the first gate electrode.

20 Claims, 19 Drawing Sheets

SEMICONDUCTOR DEVICES AND METHODS OF MANUFACTURING THE SAME

CROSS-REFERENCE TO RELATED APPLICATION

This application is based on and claims priority under 35 U.S.C. § 119 to Korean Patent Application No. 10-2023-0023788, filed on Feb. 22, 2023, in the Korean Intellectual Property Office, the disclosure of which is incorporated by reference herein in its entirety.

BACKGROUND

The inventive concept relates to semiconductor devices and methods of manufacturing the same, and more particularly, to semiconductor devices having a buried cell array transistor (BCAT) structure and methods of manufacturing the same.

In accordance with the rapid development of the electronics industry and demands of users, electronic devices are becoming smaller and lighter. Therefore, high integration may be needed for semiconductor devices used in an electronic device so that the design rule for components of the semiconductor devices has been reduced. Accordingly, the difficulty of manufacturing processes for securing connection reliability between conductive patterns constituting a semiconductor device has gradually increased.

As the degree of integration of semiconductor devices has gradually increased, semiconductor devices having a BCAT structure in which a plurality of word lines are buried in a substrate have been proposed.

SUMMARY

The inventive concept relates to semiconductor devices including a word line upper region including a first gate electrode and a second gate electrode and methods of manufacturing the same.

The inventive concept relates to semiconductor devices in which polysilicon is arranged only in a region of a word line upper region, which overlaps an active region in a vertical direction, and methods of manufacturing the same.

According to an aspect of the inventive concept, there is provided a semiconductor device comprising: substrate including a word line trench extending in a first horizontal direction; a gate dielectric layer in the word line trench; a word line extending in the first horizontal direction and in a lower portion of the word line trench on the gate dielectric layer; an insulation capping layer extending in the first horizontal direction and in an upper portion of the word line trench on the word line; and a plurality of gate electrodes on the substrate, wherein the word line comprises: a word line lower region extending in the first horizontal direction and including a first gate electrode of the plurality of gate electrodes on the gate dielectric layer; and a word line upper region extending in the first horizontal direction on the word line lower region and including a plurality of second gate electrodes of the plurality of gate electrodes and the first gate electrode of the plurality of gate electrodes.

According to another aspect of the inventive concept, there is provided a semiconductor device comprising: a substrate including a plurality of active regions; a device isolation layer that is adjacent to one of the plurality of active regions; a word line trench extending in a first horizontal direction across the plurality of active regions; a gate dielectric layer that is in the word line trench and in contact with the plurality of active regions and the device isolation layer; a word line extending in the first horizontal direction and disposed on the gate dielectric layer in a lower portion of the word line trench; and an insulation capping layer extending in the first horizontal direction and disposed in an upper portion of the word line trench on the word line, wherein the word line comprises: a word line lower region extending in the first horizontal direction and including a first gate electrode on the gate dielectric layer; and a word line upper region including the first gate electrode and a second gate electrode having a second work function less than a first work function of the first gate electrode, and extending in the first horizontal direction on the word line lower region, and wherein the second gate electrode overlaps the plurality of active regions in a vertical direction that is perpendicular to the first horizontal direction.

According to another aspect of the inventive concept, there is provided a semiconductor device comprising: a substrate including a word line trench extending in a first horizontal direction; a gate dielectric layer in the word line trench; a word line extending in the first horizontal direction and in a lower portion of the word line trench on the gate dielectric layer; an insulation capping layer extending in the first horizontal direction and in an upper portion of the word line trench on the word line; and a plurality of gate electrodes on the substrate, wherein the word line comprises: a word line lower region extending in the first horizontal direction and including a first gate electrode of the plurality of gate electrodes on the gate dielectric layer; and a word line upper region extending in the first horizontal direction on the word line lower region and including a plurality of second gate electrodes of the plurality of gate electrodes and the first gate electrode of the plurality of gate electrodes, and wherein a portion of the first gate electrode extends through the plurality of second gate electrodes in a vertical direction that is perpendicular to the first horizontal direction.

BRIEF DESCRIPTION OF THE DRAWINGS

Embodiments will be more clearly understood from the following detailed description taken in conjunction with the accompanying drawings in which.

DETAILED DESCRIPTION

Hereinafter, embodiments of the inventive concept will be described in detail with reference to the accompanying drawings. Like numeral references refer to like elements, and their repetitive descriptions may be omitted.

Figure 1:
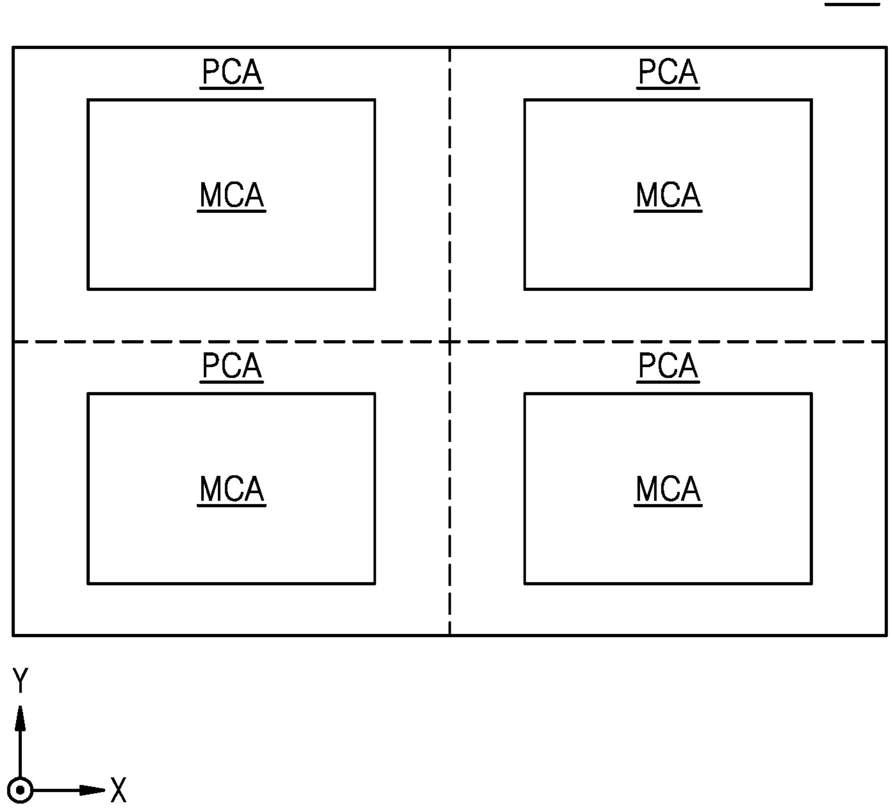
FIG. 1 is a layout diagram illustrating a schematic configuration of a semiconductor device according to some embodiments.

FIG. 1 is a layout diagram illustrating a schematic configuration of a semiconductor device 100 according to some embodiments.

Referring to FIG. 1, the semiconductor device 100 may include a substrate 102 (refer to FIG. 3) including a cell array region MCA and a peripheral circuit region PCA. According to some embodiments, the substrate 102 may include an interface region between the cell array region MCA and the peripheral circuit region PCA.

According to some embodiments, the cell array region MCA may include a memory cell region of a dynamic random access memory (DRAM) device, and the peripheral circuit region PCA may include a core region or a peripheral circuit region of the DRAM device. For example, the cell array region MCA may include a cell transistor and a capacitor structure electrically connected (e.g., connected) thereto, and the peripheral circuit region PCA may include a peripheral circuit transistor for transmitting signals and/or power to the cell transistor included in the cell array region MCA. In some embodiments, the peripheral circuit transistor may comprise various circuits such as a command decoder, a control logic, an address buffer, a row decoder, a column decoder, a sense amplifier, and a data input/output circuit.

Figure 2:
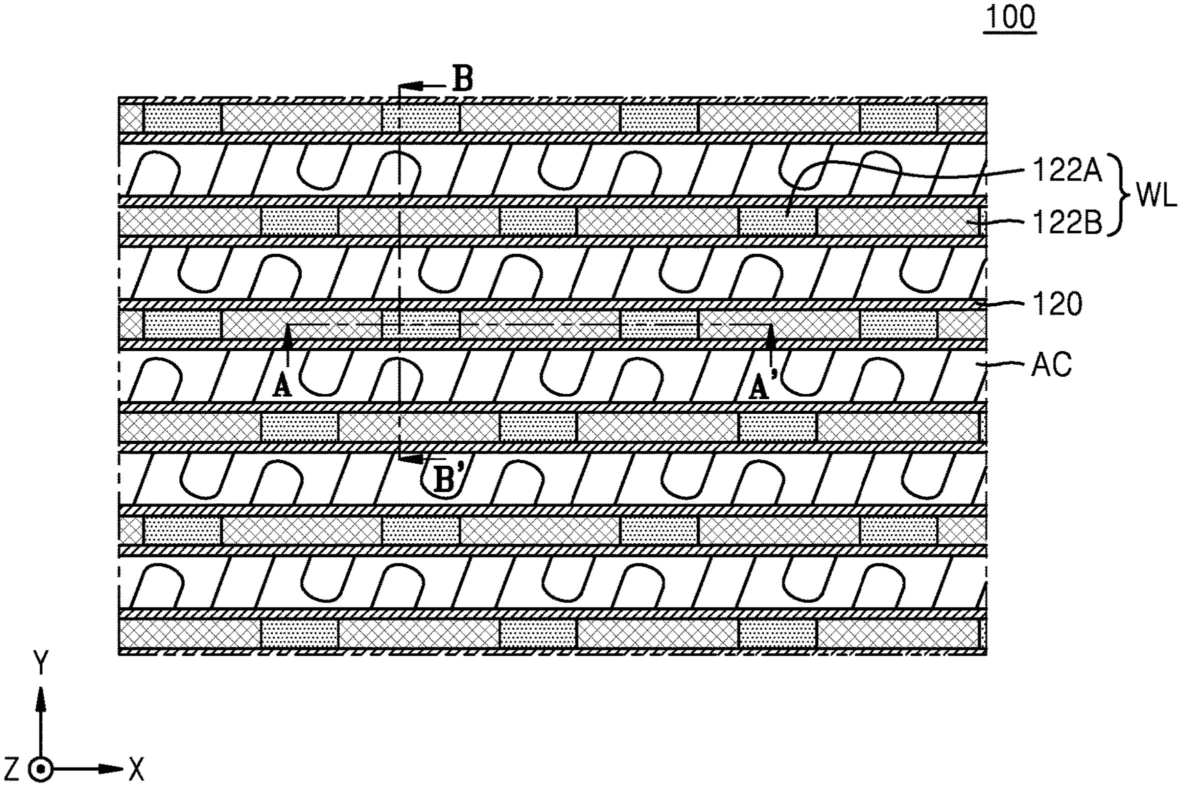
FIG. 2 is a plan layout diagram illustrating a part of a cell array region of FIG. 1.

FIG. 2 is a plan layout diagram illustrating a part of the cell array region of FIG. 1.

Referring to FIG. 2, the semiconductor device 100 may include a plurality of active regions AC arranged to extend in an oblique direction with respect to a first horizontal direction (e.g., an X direction) and a second horizontal direction (e.g., a Y direction) on an X-Y plane. The first and second horizontal directions may be parallel with a top surface of the substrate 102. A plurality of word lines WL may extend parallel to one another in the first horizontal direction (e.g., the X direction) across the plurality of active regions AC. Each of the plurality of word lines WL may have a width in the second horizontal direction (e.g., Y direction) that is substantially constant along the first horizontal direction (e.g., the X direction). The plurality of word lines WL may have a longitudinal direction in the first horizontal direction (e.g., X direction).

The plurality of word lines WL may be apart from one another by a predetermined distance in the second horizontal direction (e.g., the Y direction). The plurality of word lines WL may be apart from one another in the second horizontal direction (e.g., the Y direction) by equal distance. A gate dielectric layer 120 may extend in the first horizontal direction (e.g., the X direction) while contacting each of the plurality of word lines WL in the second horizontal direction (e.g., the Y direction). the semiconductor device 100 may further include a plurality of gate electrodes on the substrate 102, including a first gate electrode and a second gate electrode. According to some embodiments, each of the plurality of word lines WL may include the first gate electrode 122A and the second gate electrode 122B. However, the present inventive concept is not limited thereto. For example, some of the plurality of word lines WL may include the first gate electrode 122A, and others thereof may include the first gate electrode 122A and the second gate electrode 122B. A structure of each of the plurality of word lines WL including the first gate electrode 122A and the second gate electrode 122B will be described in detail below.

Figure 3:
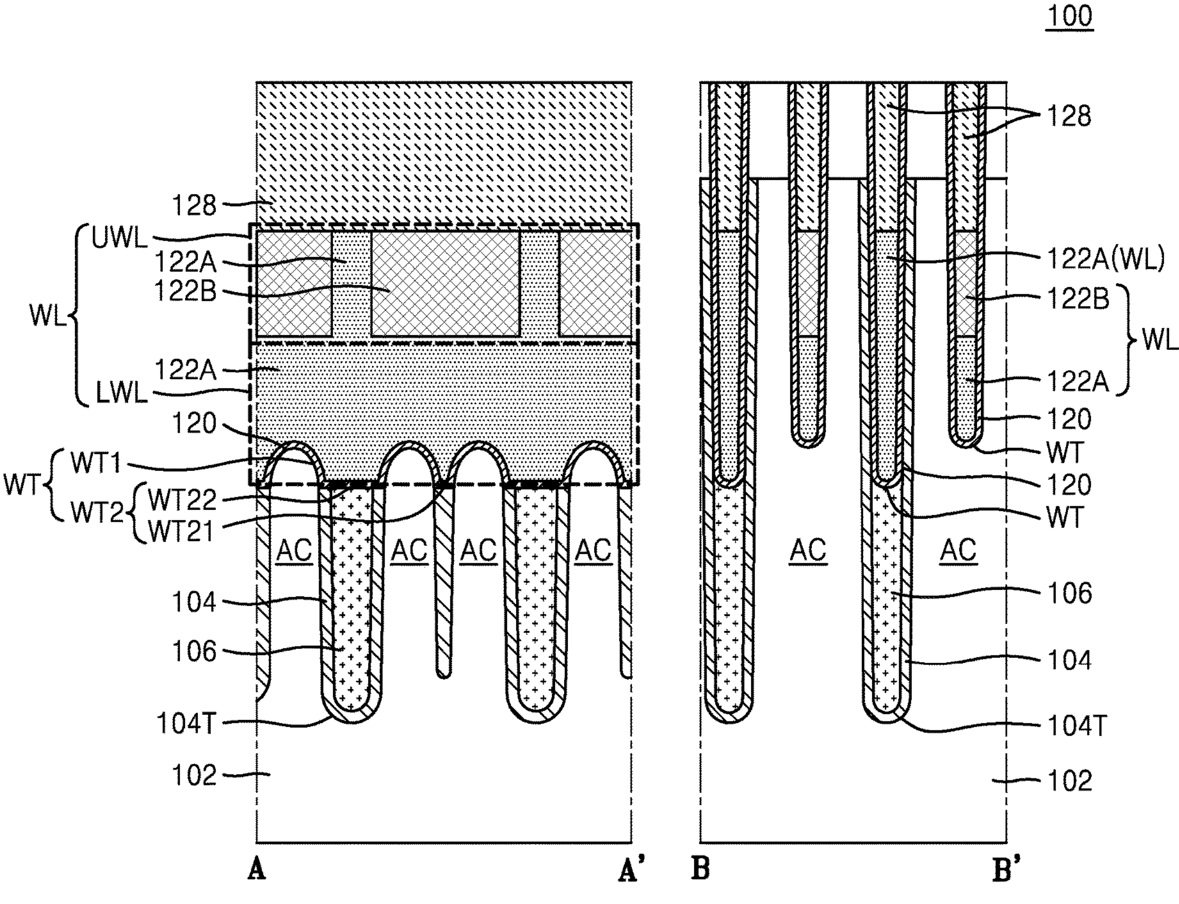
FIG. 3 is a cross-sectional view taken along line A-A' and the line B-B' of FIG. 2.

FIG. 3 is a cross-sectional view taken along the line A-A' and the line B-B' of FIG. 2.

Referring to FIG. 3, the semiconductor device 100 may include the substrate 102 having the plurality of active regions AC defined by a plurality of device isolation layers 104 and a plurality of word line trenches WT crossing the plurality of active regions AC, and the plurality of word lines WL filling the plurality of word line trenches WT. For example, an active region among the plurality of active regions AC may be adjacent to a device isolation layer among the plurality of device isolation layers 104. A plurality of device isolation trenches 104T may be formed in the substrate 102, and the plurality of device isolation layers 104 may be disposed in (e.g., may partially or fully fill) the plurality of device isolation trenches 104T. For example, the device isolation layer 104 may be disposed on (e.g., may cover or overlap) inner surfaces of the device isolation trench 104T. The device isolation layer 104 may conformally cover or overlap the inner surfaces of the device isolation trench 104T. The plurality of active regions AC may be defined in the substrate 102 by the plurality of device isolation trenches 104T and the plurality of device isolation layers 104 therein.

The substrate 102 may include, for example, silicon (Si), crystalline Si, polycrystalline Si, and/or amorphous Si. In some embodiments, the substrate 102 may include a semiconductor element such as germanium (Ge), silicon germanium (SiGe), silicon carbide (SiC), gallium arsenide (GaAs), indium arsenide (InAs), and/or indium phosphide (InP). In some embodiments, the substrate 102 may have a silicon on insulator (SOI) structure. For example, the substrate 102 may include a buried oxide (BOX) layer. The substrate 102 may include a conductive region, for example, a well doped with impurities or a structure doped with impurities.

The plurality of active regions AC may be a part of the substrate 102, which is defined by the plurality of device isolation trenches 104T. Each of the plurality of active regions AC may have a relatively long island shape having short and long axes in a plan view. In some embodiments, the plurality of active regions AC may be arranged to have long axes in an oblique direction with respect to the first horizontal direction (e.g., the X direction) and the second horizontal direction (e.g., the Y direction). The plurality of active regions AC may extend with substantially the same length in a long axis direction, and may be repeatedly arranged with a substantially constant pitch (e.g., distance).

The plurality of device isolation layers 104 may extend around (e.g., surround in a plan view) the plurality of active regions AC in the substrate 102. The device isolation layer 104 may include, for example, a silicon oxide layer, a silicon nitride layer, and/or a combination thereof. A vertical level of a bottom surface of the device isolation trench 104T may vary in accordance with a horizontal width of the device isolation trench 104T. As the horizontal width of the device isolation trench 104T increases, the vertical level of the bottom surface of the device isolation trench 104T from a top surface of the substrate 102 may increase. The vertical level may refer to a relative location in a vertical direction (e.g., a Z direction) that is perpendicular to the top surface of the substrate 102. The vertical direction may be perpendicular to the first and second horizontal directions.

A part of a lower space of the device isolation trench 104T having a larger horizontal width may be filled with a device isolation capping layer 106. In some embodiments, the device isolation capping layer 106 may include, for example, a silicon nitride layer, a silicon oxynitride layer, a silicon oxide layer, and/or a combination thereof. The word line trench WT may be formed on the device isolation capping layer 106. A part of a bottom surface of the word line trench WT may contact the device isolation capping layer 106 and/or the device isolation layer 104. A part of a side surface of the word line trench WT may contact the device isolation layer 104. The gate dielectric layer 120 may be disposed in (e.g., may partially fill) the word line trench WT. A lower space (e.g., lower portion) of the word line trench WT may be (partially or fully) filled with the word line WL, and an upper space (e.g., upper portion) thereof may be (partially or fully) filled with an insulation capping layer 128. In some embodiments, the word line WL may be disposed in a lower portion of the word line trench WT, and the insulation capping layer 128 may be disposed in an upper portion of the word line trench WT.

The plurality of word line trenches WT extending parallel to one another in the first horizontal direction (e.g., the X direction) may be formed in the substrate 102. The plurality of word line trenches WT may each have a line shape longitudinally extending in the first horizontal direction (the X direction) across the plurality of active regions AC and the plurality of device isolation layers 104. In some embodiments, steps may be formed on the bottom surfaces of the plurality of word line trenches WT. Each of the plurality of word line trenches WT may be filled with the gate dielectric layer 120, the word line WL, and the insulation capping layer 128.

As illustrated in FIG. 3, in the plurality of word line trenches WT, the vertical level of the bottom surface of each of the plurality of word line trenches WT on the plurality of active regions AC may be higher than that of the bottom surface of each of the plurality of word line trenches WT on the plurality of device isolation layers 104. Therefore, a bottom profile of the plurality of word line trenches WT may have a concavo-convex shape, and the bottom surfaces of the plurality of word lines WL may have a concavo-convex shape corresponding to the bottom profile of the plurality of word line trenches WT. In the plurality of active regions AC, a plurality of fin regions protruding upward in the vertical direction (e.g., the Z direction) from lower portions of the plurality of word lines WL (for example, corresponding to the first gate electrode 122A in the lower spaces of the word line trenches WT) toward upper portions of the plurality of word lines WL (for example, corresponding to the insulation capping layer 128 in the upper spaces of the word line trenches WT) may be formed to correspond to the bottom profile of the plurality of word line trenches WT. Therefore, a plurality of saddle fin field effect transistors (FinFET) may be formed in the plurality of active regions AC.

According to some embodiments, the word line trench WT may include a first word line trench WT1 of which bottom surface is exposed to the active region AC of the substrate 102 and a second word line trench WT2 of which bottom surface is exposed to the device isolation layer 104. According to some embodiments, the bottom surface of the first word line trench WT1 may be at a higher vertical level than the bottom surface of the second word line trench WT2. According to some embodiments, the bottom surface of the first word line trench WT1 may be curved, and the bottom surface of the second word line trench WT2 may be flat in the first horizontal direction (e.g., the X direction).

The second word line trench WT2 may include a first horizontal region WT21 and a second horizontal region WT22. The second horizontal region WT22 may be longer than the first horizontal region WT21 in the first horizontal direction (e.g., the X direction). A bottom surface of the first horizontal region WT21 may be exposed to the device isolation layer 104. A bottom surface of the second horizontal region WT22 may be exposed to the device isolation layer 104 and the device isolation capping layer 106.

The gate dielectric layer 120 may be disposed on (e.g., conformally cover) internal surfaces of the plurality of word line trenches WT to contact the plurality of active regions AC or the plurality of device isolation layers 104 and the plurality of device isolation capping layers 106. The gate dielectric layer 120 may include, for example, a silicon oxide layer, a silicon nitride layer, a silicon oxynitride layer, an oxide/nitride/oxide (ONO) layer, and/or a high-k dielectric layer having a higher dielectric constant than the a silicon oxide layer. The high-k dielectric layer may have a dielectric constant in a range of about 10 to about 25, such as, $HfO_2$, $Al_2O_3$, $HfAlO_3$, $Ta_2O_3$, and/or $TiO_2$. The gate dielectric layer 120 may have a thickness in a range of about 10 nanometers (nm) to about 30 nm. However, the inventive concept is not limited thereto.

Each of the plurality of word lines WL may longitudinally extend in the first horizontal direction (e.g., the X direction) while filling the lower space of the word line trench WT on the gate dielectric layer 120. The plurality of insulation capping layers 128 may longitudinally extend in the first horizontal direction (e.g., the X direction) while filling the upper spaces of the plurality of word line trenches WT on the plurality of word lines WL. In some embodiments, the insulation capping layer 128 may include, for example, a silicon nitride layer, a silicon oxynitride layer, a silicon oxide layer, and/or a combination thereof.

As illustrated in FIG. 3, each of the plurality of word lines WL may include a word line lower region LWL and a word line upper region UWL overlapping each other in the vertical direction (e.g., the Z direction). The word line lower region LWL may include the first gate electrode 122A. The word line upper region UWL may include the first gate electrode 122A and the second gate electrode 122B. In some embodiments, the word line upper region UWL may include a portion of the first gate electrode 122A. For example, the portion of the first gate electrode 122A may extend (e.g., protrude) from the word line lower region LWL to the word line upper region UWL. The portion of the first gate electrode 122A may extend through a plurality of second gate electrodes 122B in the vertical direction (e.g., Z direction). According to some embodiments, a ratio of a vertical direction (e.g., Z direction) length of the word line upper region UWL to a vertical direction (e.g., Z direction) length from a top of the fin region to a top of the word line lower region LWL may be 1:1. As used herein, "an element A overlapping an element B in a direction X" (or similar language) means that there is at least one line that extends in the direction X and intersects both the elements A and B.

The first gate electrode 122A may have a first work function. The second gate electrode 122B may have a second work function. In some embodiments, the second work function may be less than the first work function. Because constituent materials have different work functions (e.g., first and second work functions), threshold voltages of the first and second gate electrodes (e.g., threshold voltages of the first and second gate electrodes 122A and 122B) may be precisely controlled. The first gate electrode 122A may include, for example, metal, metal nitride, metal carbide, and/or a combination thereof. In some embodiments, the first gate electrode 122A may include, for example, titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), and/or a combination of thereof. The second gate electrode 122B may include, for example, doped polysilicon.

The work function of the second gate electrode 122B (e.g., the second work function) may be less than that of the first gate electrode 122A (e.g., the first work function). Therefore, each of the plurality of word lines WL may have a dual work function structure. In the current specification, the work function of the second gate electrode 122B (e.g., the second work function) and the work function of the first gate electrode 122A (e.g., the first work function) may each refer to an effective work function. The effective work function may refer to a work function in which each of the first gate electrode 122A and the second gate electrode 122B is deformed by an influence of a junction interface between each of the first gate electrode 122A and the second gate electrode 122B and the gate dielectric layer 120.

In the plurality of active regions AC, a plurality of source/drain regions may be arranged on both sides of the plurality of word lines WL. The plurality of source/drain regions may include impurity regions including impurity ions implanted into the substrate 102.

Because the second gate electrode 122B having a relatively small work function is arranged on the first gate electrode 122A having a relatively large work function in each of the plurality of word lines WL, the second gate electrode 122B having a relatively small work function may be arranged closer to the source/drain region. Therefore, an increase in gate induced drain leakage (GIDL) in the semiconductor device 100 may be suppressed, and reduction in data retention time may be prevented so that refresh characteristics may improve.

The word line lower region LWL may longitudinally extend in the first horizontal direction (e.g., the X direction) while filling the lower space of the word line trench WT on the gate dielectric layer 120. The word line lower region LWL may conformally cover an internal surface of the gate dielectric layer 120. In some embodiments, the word line lower region LWL may include the first gate electrode 122A.

The word line upper region UWL may longitudinally extend in the first horizontal direction (e.g., the X direction) while filling the upper space of the word line trench WT on the word line lower region LWL. The word line upper region UWL may include a plurality of different gate electrodes. For example, the word line upper region UWL may include the first gate electrode 122A and the second gate electrode 122B. The first gate electrode 122A and the second gate electrode 122B of the word line upper region UWL may be arranged to cross (e.g., overlap) each other in the first horizontal direction (e.g., the X direction). As described above, the second gate electrode 122B may have a work function less than that of the first gate electrode 122A. For example, the second gate electrode 122B may include doped polysilicon.

Referring to FIG. 3, the second gate electrode 122B of the word line upper region UWL may be arranged in a portion of the word line upper region UWL, which overlaps the plurality of active regions AC in the vertical direction (e.g., the Z direction). The first gate electrode 122A of the word line upper region UWL may be arranged in a portion of the word line upper region UWL, which overlaps the device isolation layer 104 in the vertical direction (e.g., the Z direction).

Specifically, the first gate electrode 122A of the word line upper region UWL may be arranged in a portion of the word line upper region UWL, which overlaps the second horizontal region WT22 in the vertical direction (e.g., the Z direction). The second gate electrode 122B may be arranged in a portion of the word line upper region UWL, which overlaps the first horizontal region WT21 in the vertical direction (e.g., the Z direction). Therefore, the second gate electrode 122B overlapping the plurality of active regions AC with the first horizontal region WT21 therebetween in the vertical direction (e.g., the Z direction) may be longitudinally formed in the first horizontal direction (e.g., the X direction). Because the first horizontal region WT21 has a smaller length than the second horizontal region WT22, the first gate electrode 122A may be formed in the word line upper region UWL overlapping the first horizontal region WT21 in the vertical direction (e.g., the Z direction) to improve process efficiency.

The second gate electrode 122B may be arranged in the word line upper region UWL overlapping the plurality of active regions AC, that is, a transistor region of a memory cell in the vertical direction (e.g., the Z direction). By arranging the second gate electrode 122B in the word line upper region UWL overlapping the transistor region in the vertical direction (e.g., the Z direction), leakage current may be suppressed. Specifically, because a structure of polysilicon in a transistor is maintained by arranging polysilicon only in a portion overlapping the plurality of active regions AC in the vertical direction (e.g., the Z direction), leakage current reduction effect may also be maintained.

In addition, because the first gate electrode 122A in each of the plurality of word lines WL included in the semiconductor device 100 has a relatively small resistivity and a relatively large work function, resistance of the plurality of word lines WL may be reduced and a threshold voltage targeted by the transistor may be precisely controlled. Therefore, stable electrical characteristics may be secured in the semiconductor device 100.

Each of the plurality of word lines WL according to the inventive concept may include the first gate electrode 122A and the second gate electrode 122B having a higher resistivity than the first gate electrode 122A. In some embodiments, the second gate electrode 122B may include, for example, polysilicon. In the semiconductor device 100 according to the inventive concept, the second gate electrode 122B may be arranged only in the word line upper region UWL overlapping the plurality of active regions AC in the vertical direction (e.g., the Z direction). Therefore, a volume occupied by the second gate electrode 122B in each of the plurality of word lines WL may be reduced. Because a volume occupied by the first gate electrode 122A including, for example, metal increases and the volume occupied by the second gate electrode 122B including, for example, polysilicon is reduced, the resistance of the plurality of word lines WL may be reduced.

According to some embodiments, the second gate electrode 122B may be arranged such that a top surface thereof contacts the insulation capping layer 128. The second gate electrode 122B may be arranged such that a bottom surface and side surfaces thereof contact the first gate electrode 122A.

For example, in the vertical direction (e.g., the Z direction), the second gate electrode 122B may be arranged between the first gate electrode 122A (e.g., the first gate electrode 122A of the word line lower region LWL) and the insulation capping layer 128. The first gate electrode 122A (e.g., the first gate electrode 122A of the word line lower region LWL) may be apart from the insulation capping layer 128 in the vertical direction (e.g., the Z direction) with the second gate electrode 122B therebetween. The top surface of the second gate electrode 122B may contact a bottom surface of the insulation capping layer 128, and the bottom surface of the second gate electrode 122B may contact a top surface of the first gate electrode 122A (e.g., the first gate electrode 122A of the word line lower region LWL).

The top surface of the first gate electrode 122A of the word line upper region UWL may contact the insulation capping layer 128. Side surfaces of the first gate electrode 122A of the word line upper region UWL may contact the second gate electrode 122B. The first gate electrode 122A of the word line upper region UWL may be integrally formed with the first gate electrode 122A of the word line lower region LWL. Therefore, the first gate electrode 122A may extend in the first horizontal direction (e.g., the X direction) and may protrude upward in a vertical direction (e.g., the Z direction) from the lower portion of the word line WL toward the insulation capping layer 128. That is, the top surface of the first gate electrode 122A may extend in a concavo-convex shape in the first horizontal direction (e.g., the X direction).

In the word line lower region LWL, the vertical direction (e.g., Z direction) length of a portion of the first gate electrode 122A, which vertically overlaps the plurality of active regions AC, may be less than a vertical direction (e.g., Z direction) length of a portion of the first gate electrode 122A, which vertically overlaps the device isolation layer 104.

The word line upper region UWL and the word line lower region LWL may have the same vertical direction (e.g., Z direction) length. However, the inventive concept is not limited thereto. The word line upper region UWL and the word line lower region LWL may be variously adjusted as needed. The vertical direction (e.g., Z direction) lengths of the first gate electrode 122A and the second gate electrode 122B included in one word line WL may be variously adjusted as needed.

The insulation capping layer 128 may fill a remaining space of the word line trench WT on the word line WL. In some embodiments, the insulation capping layer 128 may include, for example, a silicon nitride layer, a silicon oxynitride layer, a silicon oxide layer, and/or a combination thereof. In some examples, the insulation capping layer 128 may include a silicon nitride layer. In some examples, the insulation capping layer 128 may include a silicon oxide layer covering a top surface of the word line upper region UWL and a silicon nitride layer filling the upper space of the word line trench WT on the silicon oxide layer.

FIGS. 4 to 13 are cross-sectional views taken along the line A-A' and the line B-B' and illustrating a method of manufacturing the semiconductor device 100 according to some embodiments.

Figure 4:
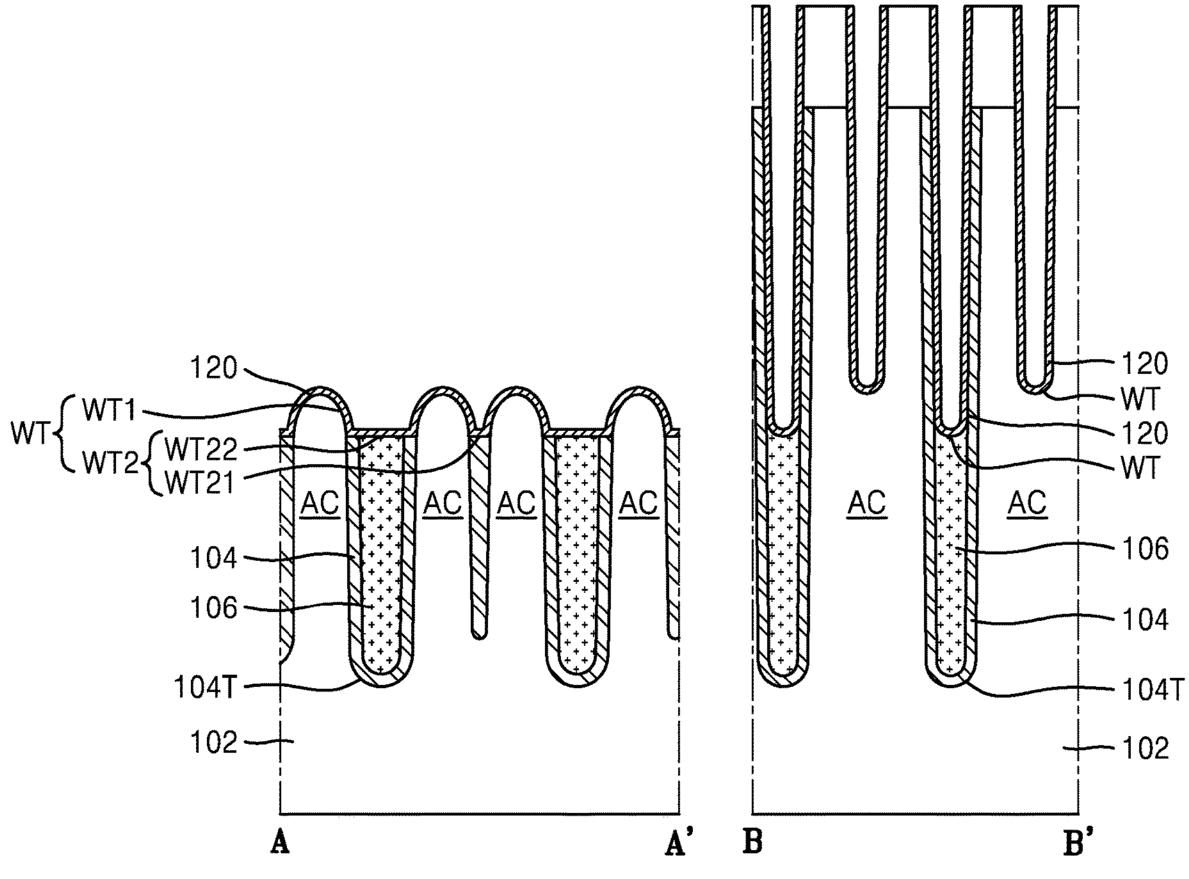
FIGS. 4 to 13 are cross-sectional views taken along line A-A' and line B-B' and illustrating a method of manufacturing a semiconductor device according to some embodiments.

Referring to FIG. 4, the method of manufacturing the semiconductor device 100 according to some embodiments may include operation of preparing the substrate 102 having the plurality of active regions AC. The plurality of active regions AC may be defined by forming the plurality of device isolation layers 104 in the substrate 102. The plurality of active regions AC may have the plurality of source/drain regions formed by an ion implantation process.

The plurality of device isolation trenches 104T may be formed in the substrate 102. The plurality of device isolation trenches 104T may be filled (e.g., partially filled) with the plurality of device isolation layers 104. For example, the plurality of device isolation layer 104 may be disposed on (e.g., conformally cover or overlap) an inner surface of the plurality of device isolation trenches 104T, respectively. The lower spaces of the plurality of device isolation trenches 104T may be filled with the plurality of device isolation capping layers 106. The plurality of device isolation capping layers 106 may be formed on (e.g., may contact) the plurality of device isolation layer 104. The plurality of word line trenches WT may be formed in the substrate 102. At least some parts of the plurality of word line trenches WT may be formed on the plurality of device isolation capping layers 106 and may contact the plurality of device isolation layers 104. In addition, at least some parts of the plurality of word line trenches WT may be formed to contact the plurality of active regions AC. Each of the plurality of word line trenches WT may be filled (e.g., partially filled) with the gate dielectric layer 120. For example, the gate dielectric layer 120 may be disposed on (e.g., conformally cover or overlap) an inner surface of each plurality of word line trenches WT.

Figure 5:
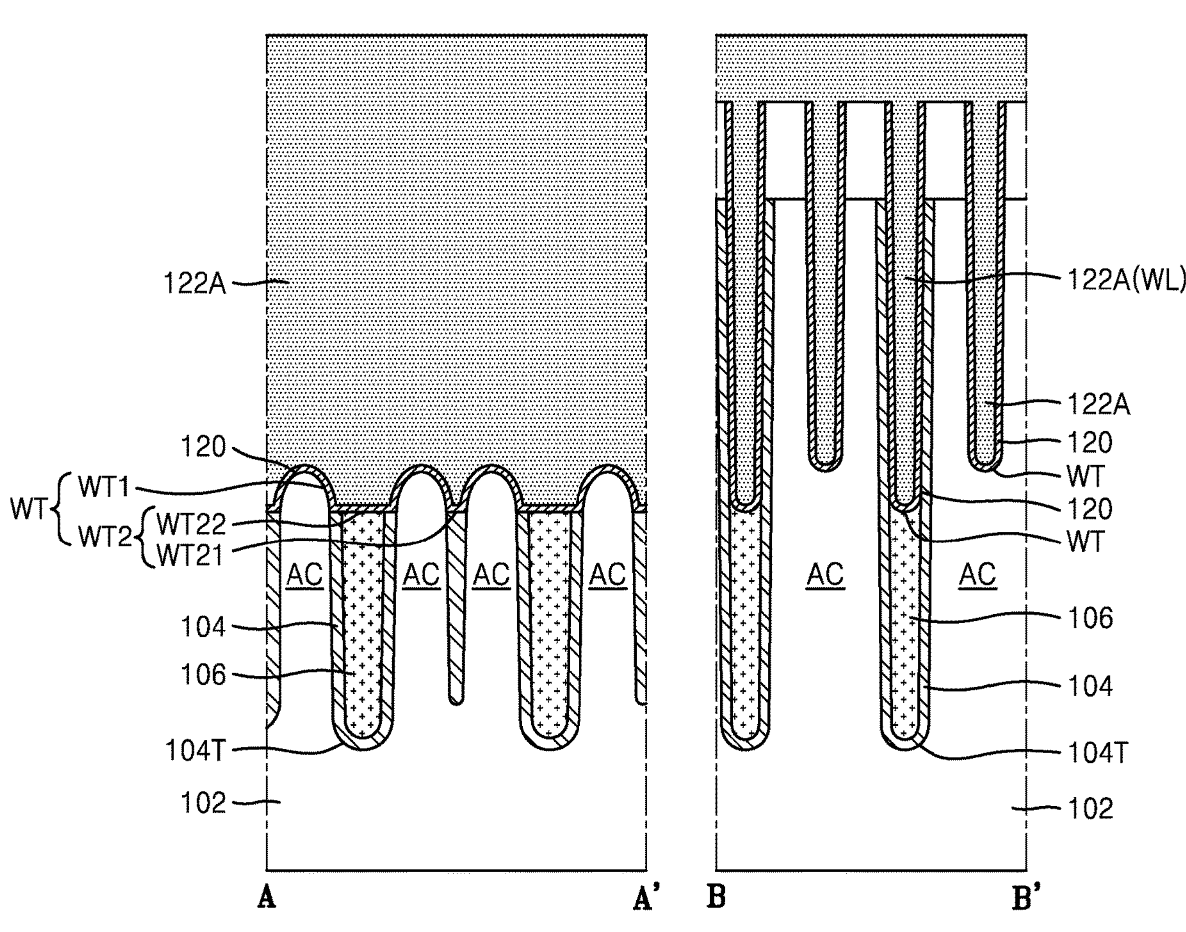

Referring to FIG. 5, the first gate electrode 122A may be deposited on the gate dielectric layer 120. The first gate electrode 122A may be deposited such that the bottom surface thereof contacts the gate dielectric layer 120 and to extend in the first horizontal direction (e.g., the X direction). The first gate electrode 122A may cover a top surface of the gate dielectric layer 120.

Chemical mechanical polishing (CMP) may be performed on the top surface of the first gate electrode 122A. Because the top surface of the first gate electrode 122A is polished, the top surface of the first gate electrode 122A may be planarized.

Figure 6:
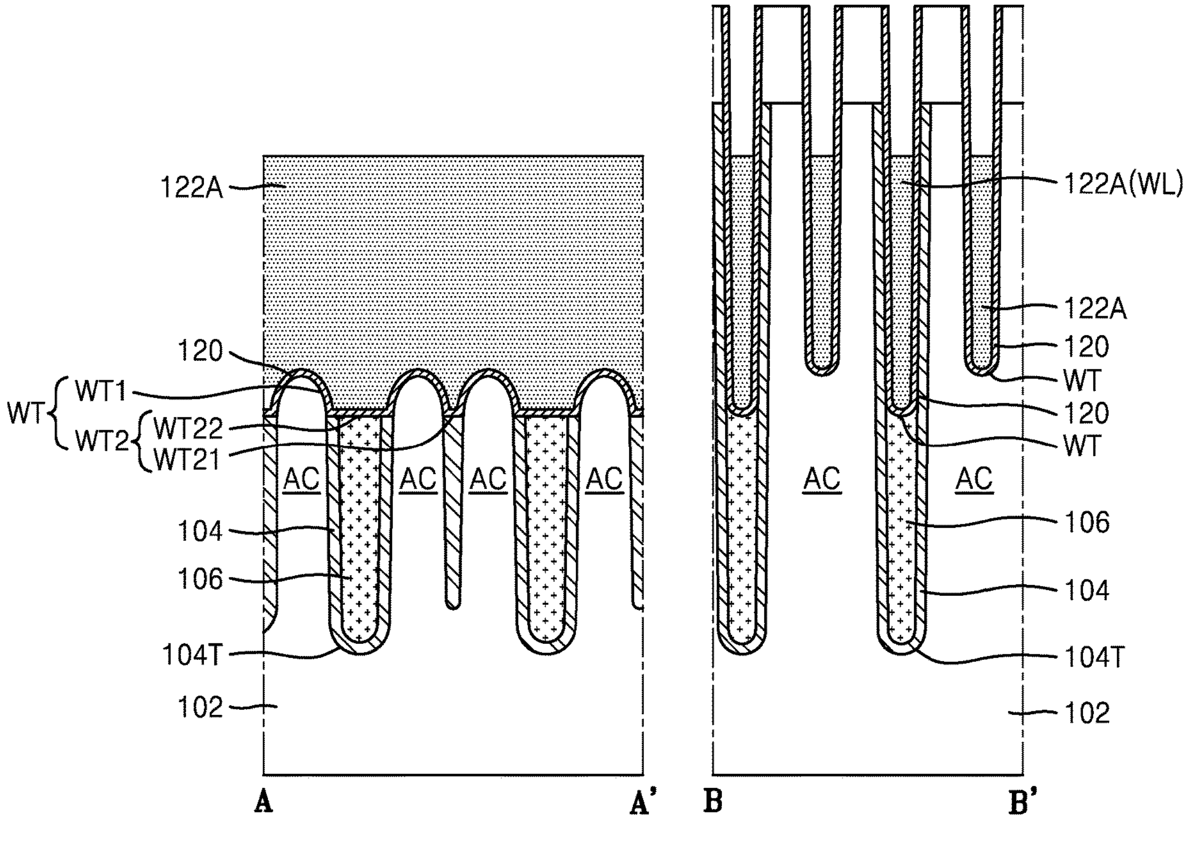

Referring to FIG. 6, a part of the first gate electrode 122A may be etched. The top surface of the first gate electrode 122A may be etched back. The top surface of the first gate electrode 122A may be etched flat in the first horizontal direction (e.g., the X direction). The first gate electrode 122A may be etched back to form the word line WL. The word line WL may comprise the word line upper region UWL (refer to FIG. 3) and the word line lower region LWL (refer to FIG. 3).

Figure 7:
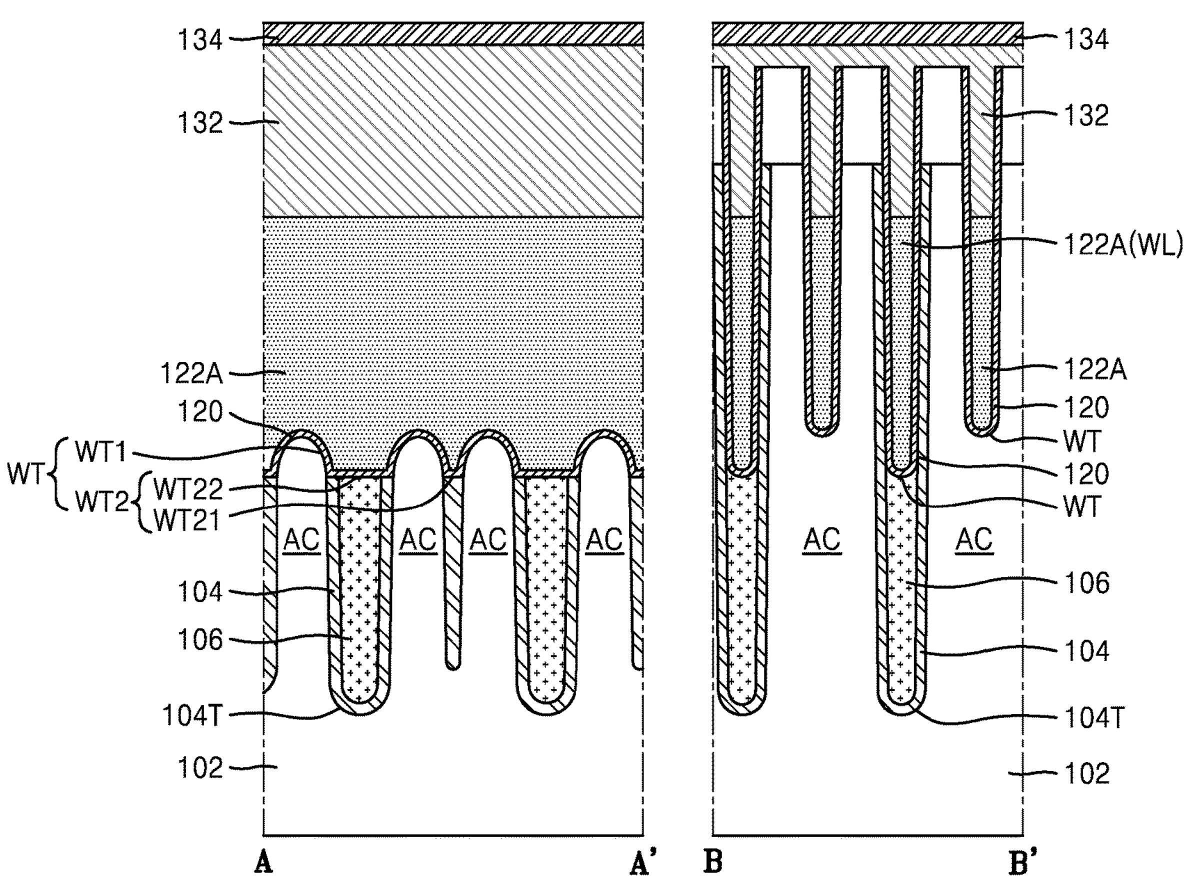

Referring to FIG. 7, a first sacrificial layer 132 and a second sacrificial layer 134 may be formed on the first gate electrode 122A. After depositing the first sacrificial layer 132 on the top surface of the first gate electrode 122A, the second sacrificial layer 134 may be deposited on a top surface of the first sacrificial layer 132. The first sacrificial layer 132 may include, for example, an organic material. For example, the first sacrificial layer 132 may include a spin on hardmask (SOH). The second sacrificial layer 134 may include, for example, an inorganic material. The second sacrificial layer 134 may include, for example, PeSiON.

Figure 8:
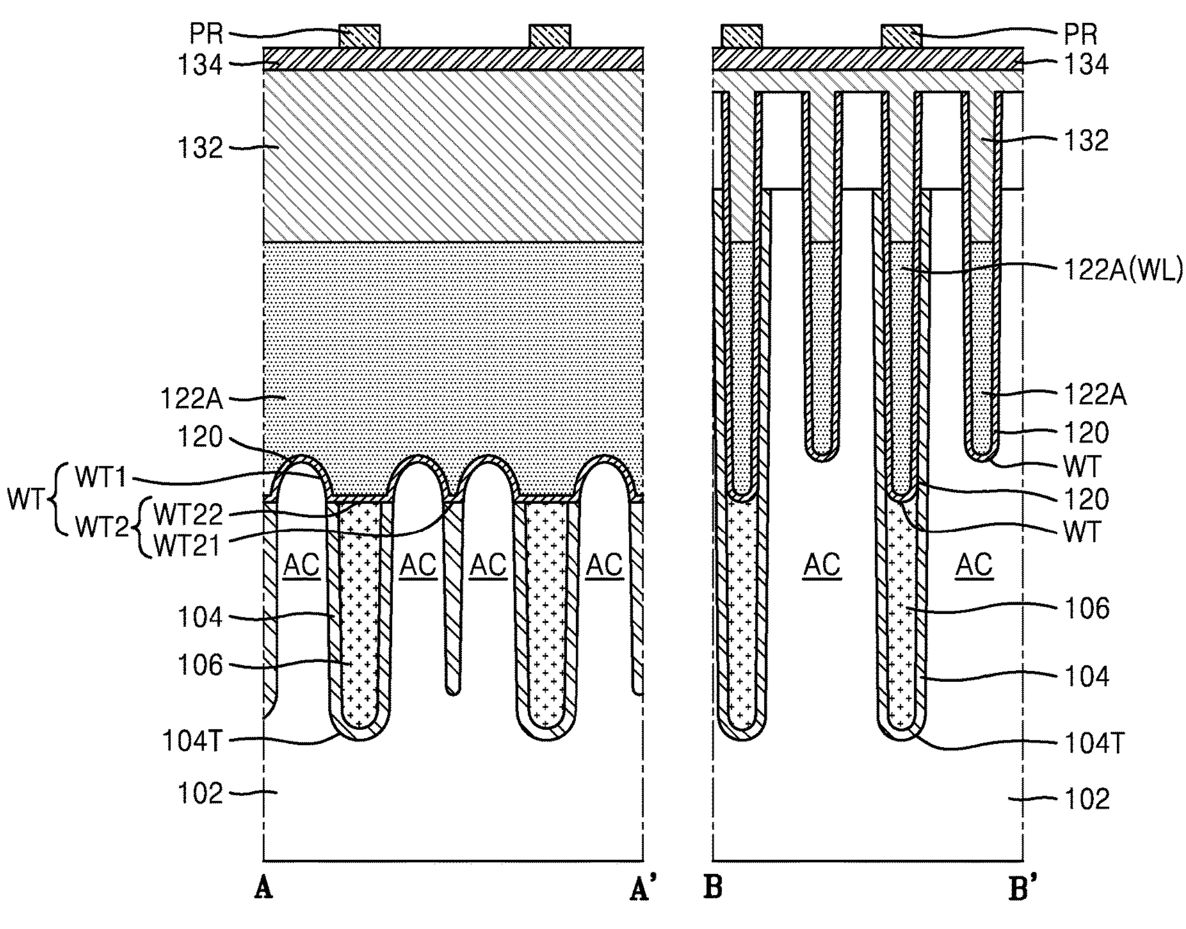

Referring to FIG. 8, a photoresist PR may be formed on at least a part of a top surface of the second sacrificial layer 134. A partial region of the word line upper region UWL (refer to FIG. 3) may be etched by using the photoresist PR on at least a part of the top surface of the second sacrificial layer 134 (refer to FIG. 9). The photoresist PR may be formed in a portion overlapping each of the plurality of device isolation layers 104 in the vertical direction (e.g., the Z direction).

Figure 9:
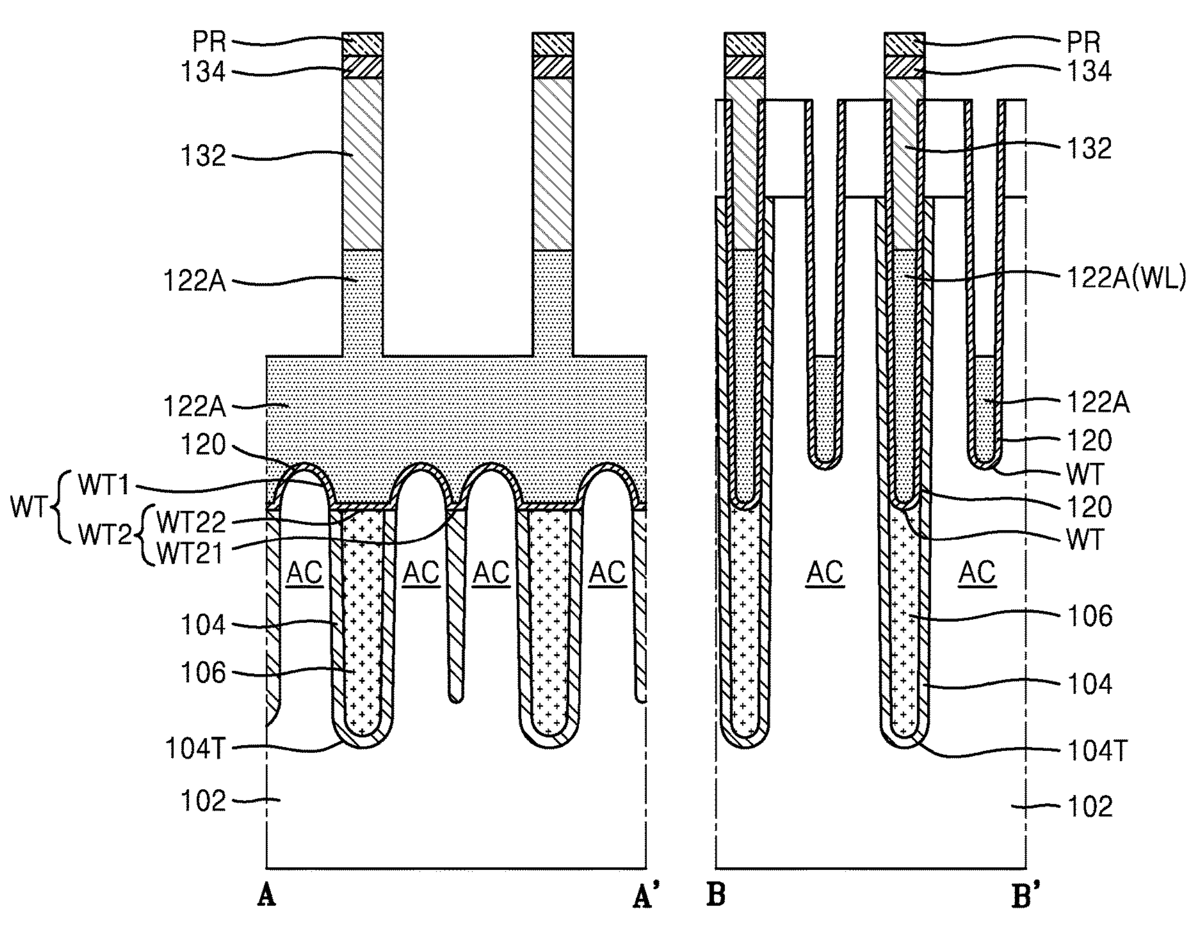

Referring to FIG. 9, at least a part of each of the first sacrificial layer 132, the second sacrificial layer 134, and the first gate electrode 122A may be etched by using the photoresist PR. The first sacrificial layer 132, the second sacrificial layer 134, and the first gate electrode 122A may be etched back in the vertical direction (e.g., the Z direction) in which the photoresist PR is not formed. A partial region of the word line upper region UWL (refer to FIG. 3) may be formed by etching a part of each of the first sacrificial layer 132, the second sacrificial layer 134, and the first gate electrode 122A by using the photoresist PR. In some embodiments, the first gate electrode 122A may be etched back only to the word line upper region UWL. For example, only the first gate electrode 122A in the portion of the word line upper region UWL, which overlaps the plurality of active regions AC in the vertical direction (e.g., the Z direction), may be etched.

Figure 10:
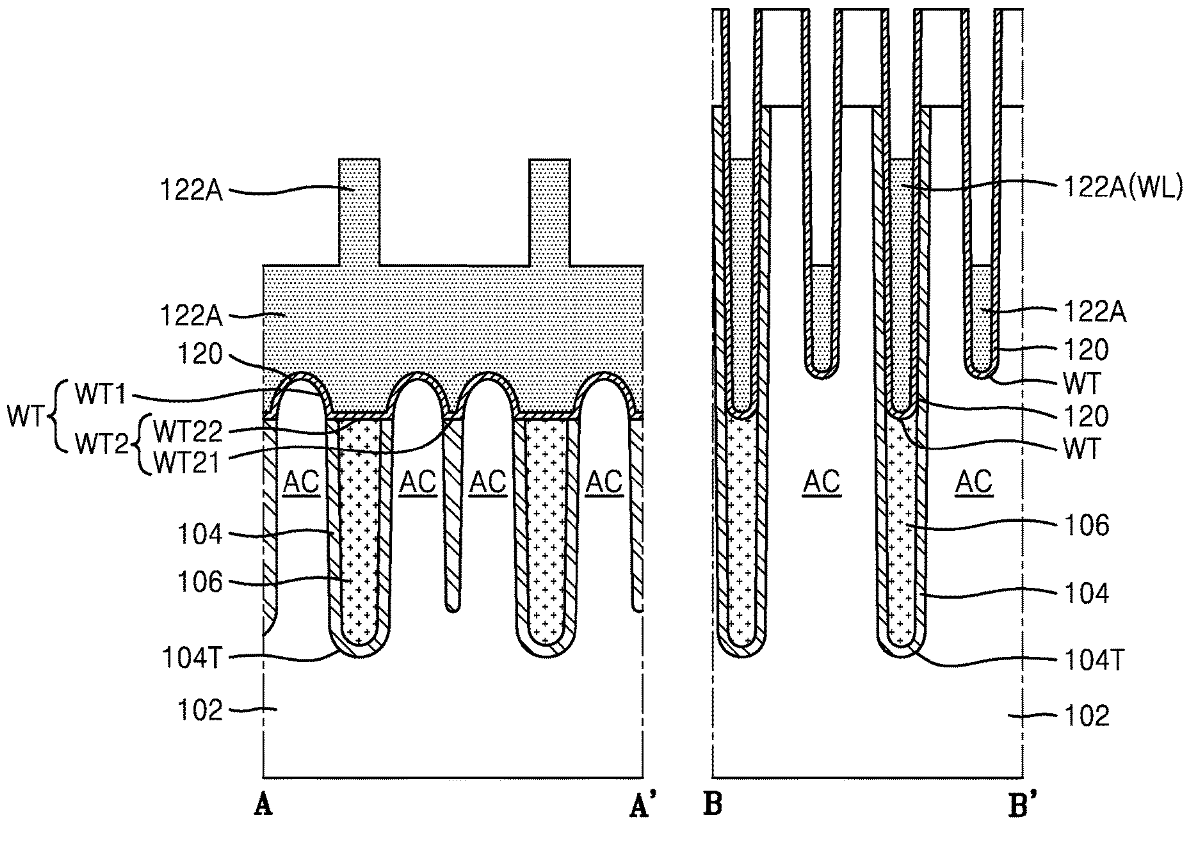

Referring to FIG. 10, the first sacrificial layer 132, the second sacrificial layer 134, and the photoresist PR sequentially remaining on the first gate electrode 122A may be removed. The first sacrificial layer 132, the second sacrificial layer 134, and the photoresist PR may be removed, for example, by an ashing process and a strip process.

Figure 11:
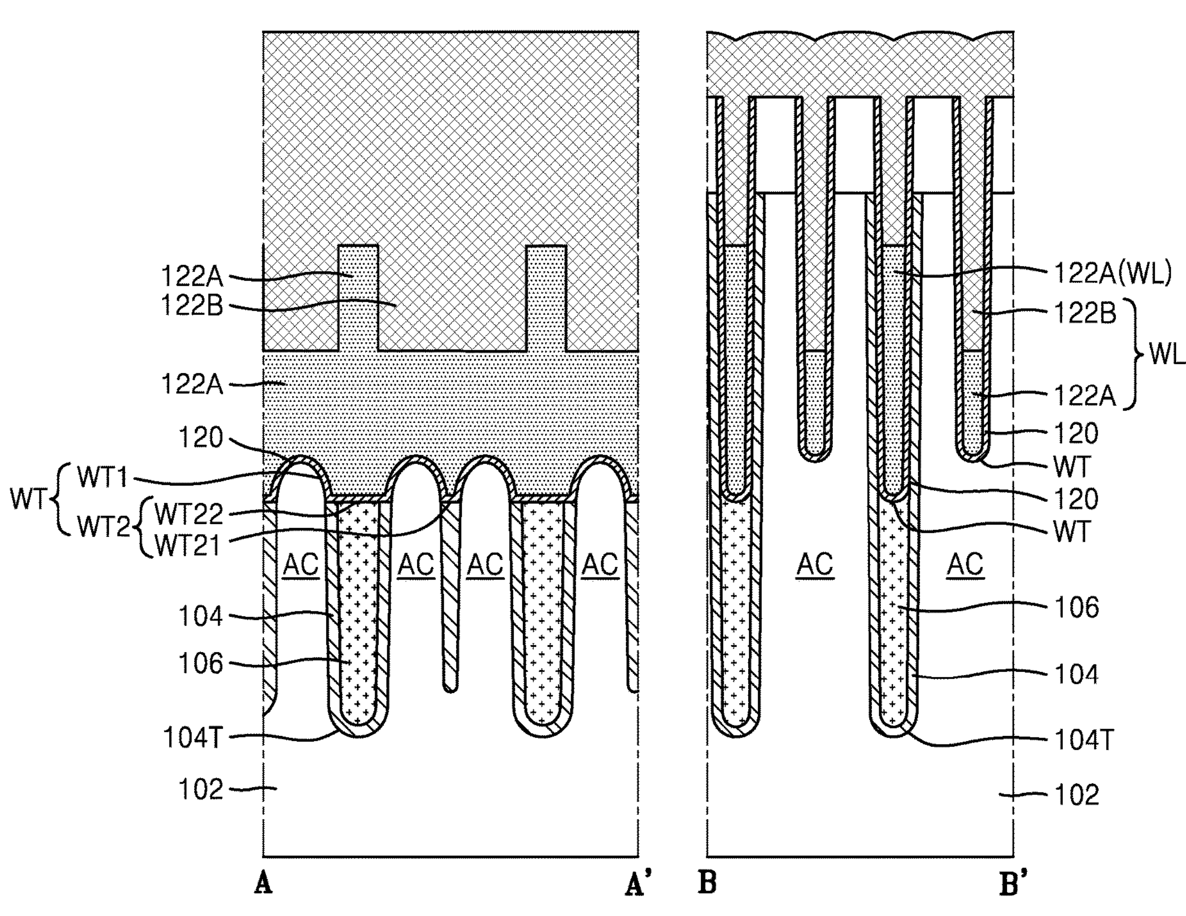

Referring to FIG. 11, the second gate electrode 122B may be formed on the first gate electrode 122A. In this case, the second gate electrode 122B may include, for example, polysilicon. The second gate electrode 122B may be deposited such that the bottom surface thereof contacts the first gate electrode 122A and to extend in the first horizontal direction (e.g., the X direction). The second gate electrode 122B may cover the top surface of the first gate electrode 122A.

Figure 12:
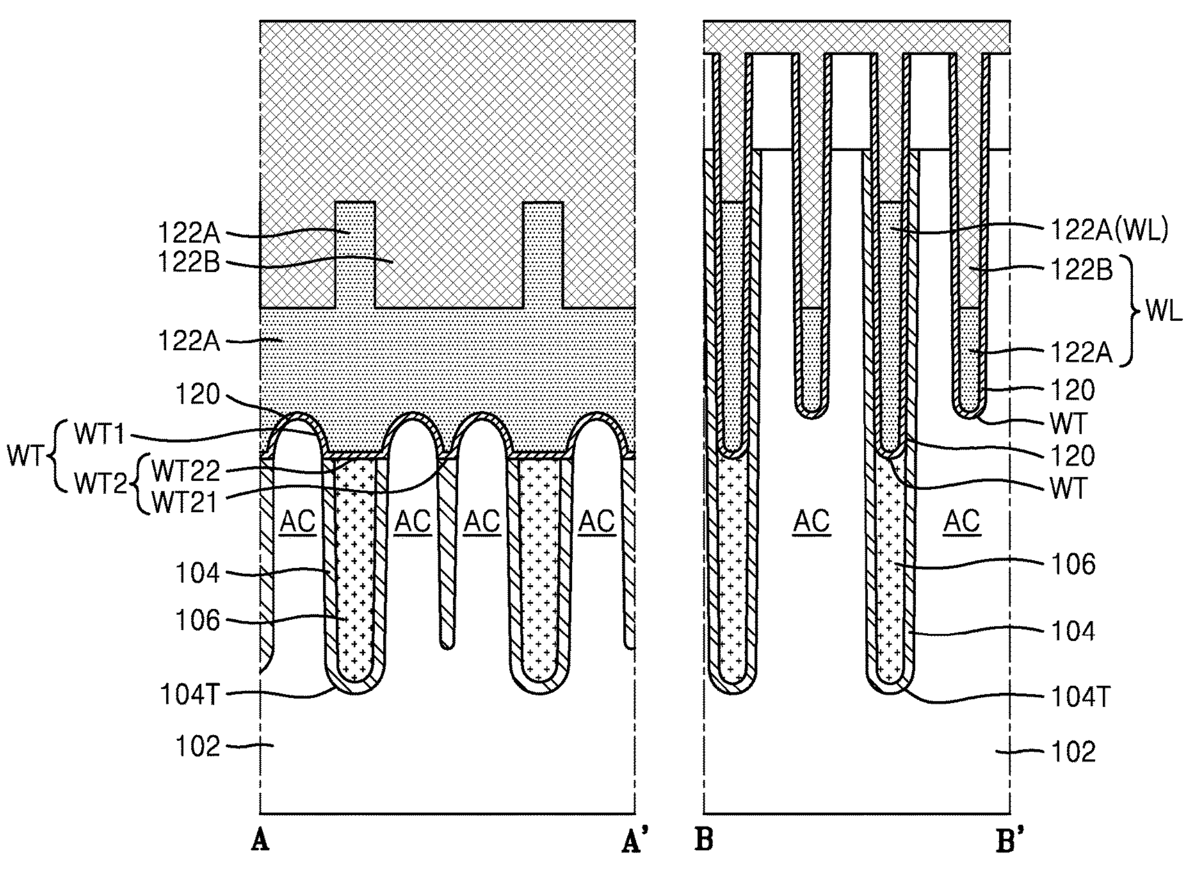

Referring to FIG. 12, CMP may be performed on the top surface of the second gate electrode 122B. Because the top surface of the second gate electrode 122B is polished, the top surface of the second gate electrode 122B may be planarized.

Figure 13:
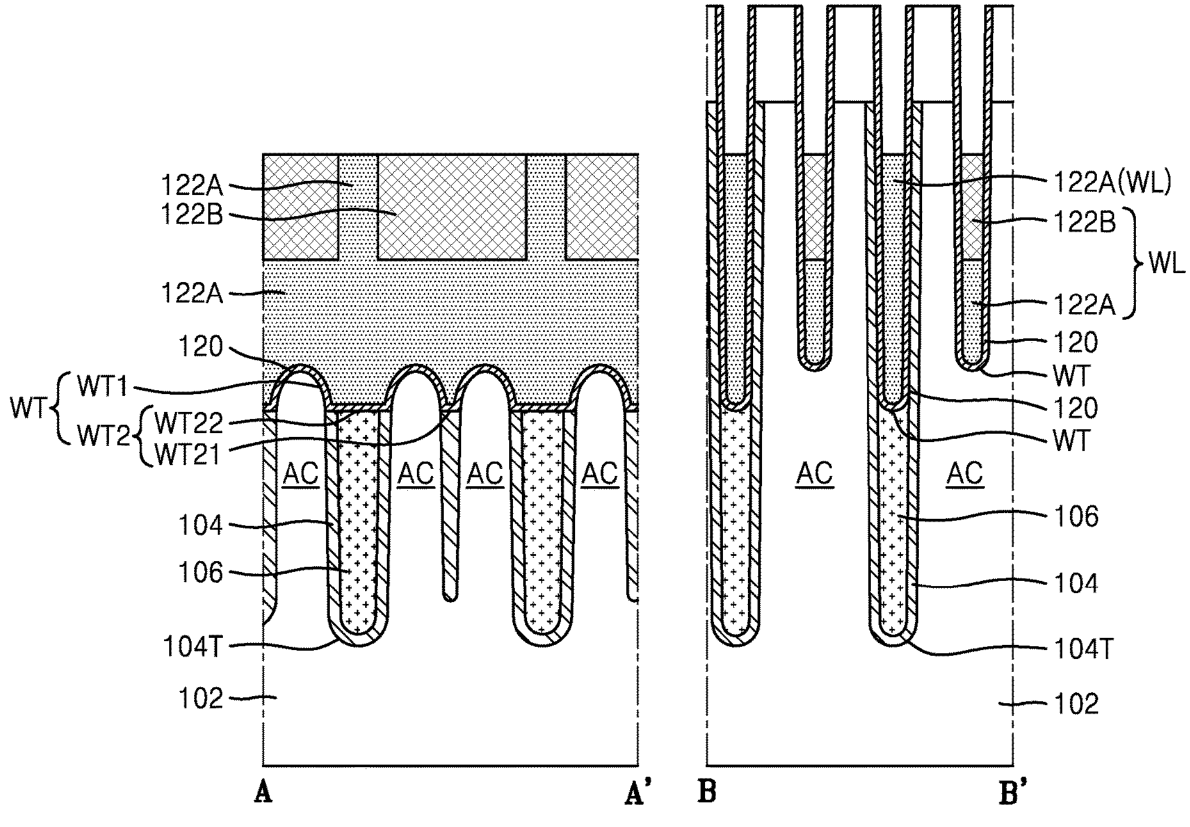

Referring to FIG. 13, a part of the second gate electrode 122B may be etched. The top surface of the second gate electrode 122B may be etched back. The top surface of the second gate electrode 122B may be etched flat in the first horizontal direction (e.g., the X direction). In some embodiments, a vertical level of the top surface of the second gate electrode 122B may be the same as that of the top surface of the first gate electrode 122A of the word line upper region UWL (refer to FIG. 3). The second gate electrode 122B may be etched back to form the word line upper region UWL. The word line upper region UWL may include the first gate electrode 122A and the second gate electrode 122B, and the first gate electrode 122A and the second gate electrode 122B of the word line upper region UWL may be arranged to cross (e.g., overlap) each other in the first horizontal direction (e.g., the X direction). For example, the first and second gate electrodes 122A and 122B of the word line upper region UWL may be alternately arranged in the first horizontal direction (e.g., the X direction).

Next, referring to FIG. 3, the insulation capping layer 128 may be formed on the word line WL. The plurality of insulation capping layers 128 may longitudinally extend in the first horizontal direction (e.g., the X direction) while filling the upper spaces of the plurality of word line trenches WT on the plurality of word lines WL. In some embodiments, the insulation capping layer 128 may include, for example, a silicon nitride layer, a silicon oxynitride layer, a silicon oxide layer, and/or a combination thereof. The bottom surface of the insulation capping layer 128 may contact the first gate electrode 122A or the second gate electrode 122B of the word line upper region UWL. In some embodiments, the insulation capping layer 128 may be formed through deposition, polishing, and etch-back processes.

FIGS. 14A, 14B, 15A, 15B, 16A, and 16B are views illustrating a photoresist process in methods of manufacturing the semiconductor device 100 according to some embodiments.

Figure 14A:
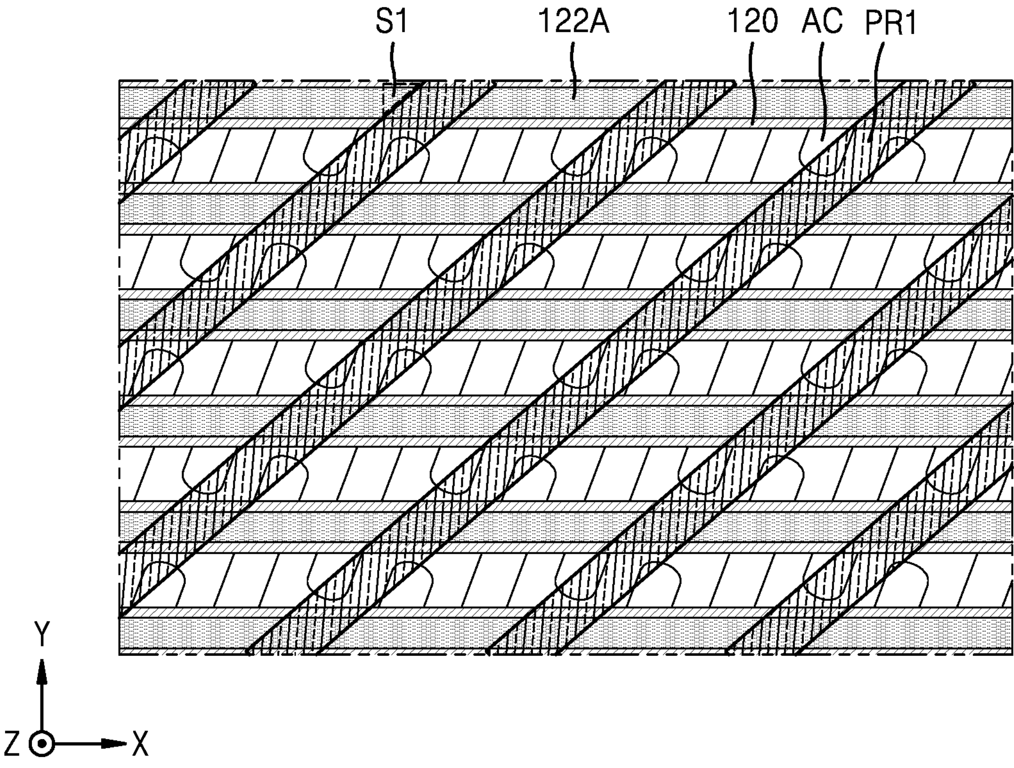
FIGS. 14A, 14B, 15A, 15B, 16A, and 16B are views illustrating a photoresist process in methods of manufacturing a semiconductor device according to some embodiments.
Figure 14B:
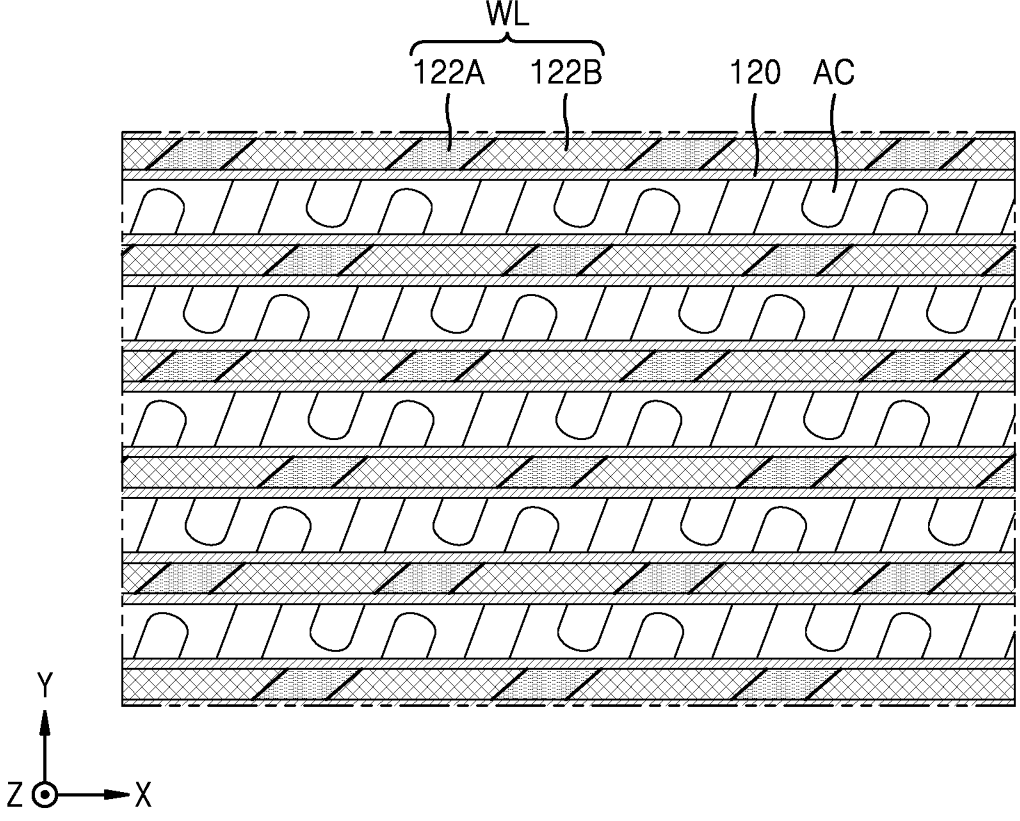

FIG. 14A is a view in which a photoresist is formed on an X-Y plane of the semiconductor device 100 according to some embodiments, and FIG. 14B is a view in which the first gate electrode 122A is etched and the second gate electrode 122B is formed according to FIG. 14A. Referring to FIG. 14A, a plurality of first photoresists PR1 may be arranged to longitudinally extend in the oblique direction with respect to the first horizontal direction (e.g., the X direction) and the second horizontal direction (e.g., the Y direction) on the X-Y plane of the semiconductor device 100. A region of the first gate electrode 122A to be etched in the word line upper region UWL may vary in accordance with a formation position of the first photoresist PR1 (refer to FIG. 14B). In FIG. 14A, production efficiency may be increased by using a quadruple patterning tech (QPT) process.

Referring to FIG. 14B, the word line upper region UWL may be etched back except for a portion overlapping the first photoresist PR1 in the vertical direction (e.g., the Z direction). When the first photoresist PR1 is used, a first space S1 (refer to FIG. 14A) is generated, and the word line upper region UWL overlapping the first space S1 in the vertical direction (e.g., the Z direction) may be etched back. The first space S1 may be a region of the word line upper region UWL, which is exposed from the first photoresist PR1. The first gate electrode 122A may be etched back and the second gate electrode 122B may be formed in the word line upper region UWL overlapping the first space S1 in the vertical direction (e.g., the Z direction).

Figure 15A:
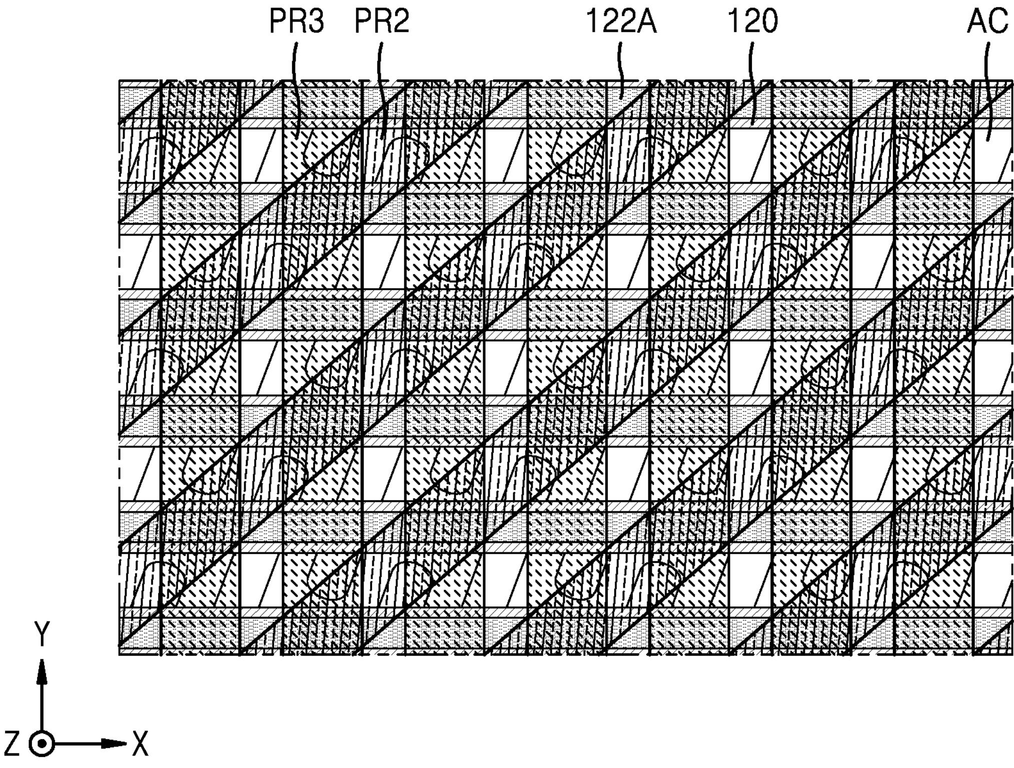
Figure 15B:
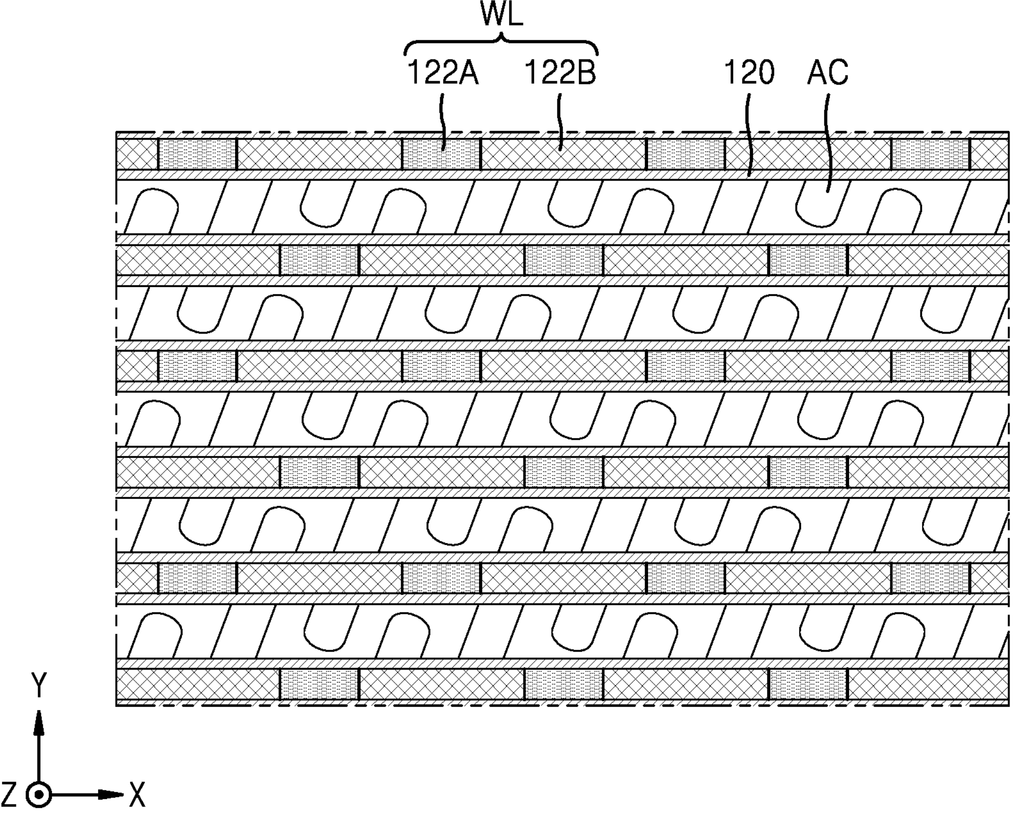

FIG. 15A is a view in which a photoresist is formed on an X-Y plane of the semiconductor device 100 according to some embodiments, and FIG. 15B is a view in which the first gate electrode 122A is etched and the second gate electrode 122B is formed according to FIG. 15A. Referring to FIG. 15A, a plurality of second photoresists PR2 and a plurality of third photoresists PR3 may be formed on the X-Y plane of the semiconductor device 100. The third photoresist PR3 may extend in the second horizontal direction (e.g., the Y direction). The second photoresist PR2 may longitudinally extend in the oblique direction with respect to the first horizontal direction (e.g., the X direction) and the second horizontal direction (e.g., the Y direction). The region of the first gate electrode 122A to be etched in the word line upper region UWL may vary in accordance with formation positions of the second photoresist PR2 and the third photoresist PR3 (refer to FIG. 15B).

In FIG. 15A, the second gate electrode 122B may be precisely formed without generating the first space S1 of FIG. 14A by using a double patterning tech (DPT) process twice. In the embodiment of FIG. 15A, an area of the second gate electrode 122B may be reduced compared to the embodiment of FIG. 14A. Therefore, the resistance of the word line WL may be reduced compared to the embodiment of FIG. 14A.

Referring to FIG. 15B, the word line upper region UWL may be etched back except for a portion commonly overlapping the second photoresist PR2 and the third photoresist PR3 in the vertical direction (e.g., the Z direction). Referring to FIG. 15A, the first space S1 or a second space S2 (refer to FIG. 16) may not be generated. The first gate electrode 122A in a partial region of the word line upper region UWL may be etched back, and the second gate electrode 122B may be formed in the etched partial region. That is, the word line upper region UWL may be precisely etched back and the second gate electrode 122B may be formed. In addition, in the word line upper region UWL, the area of the second gate electrode 122B may be reduced and an area of the first gate electrode 122A may be increased.

Figure 16A:
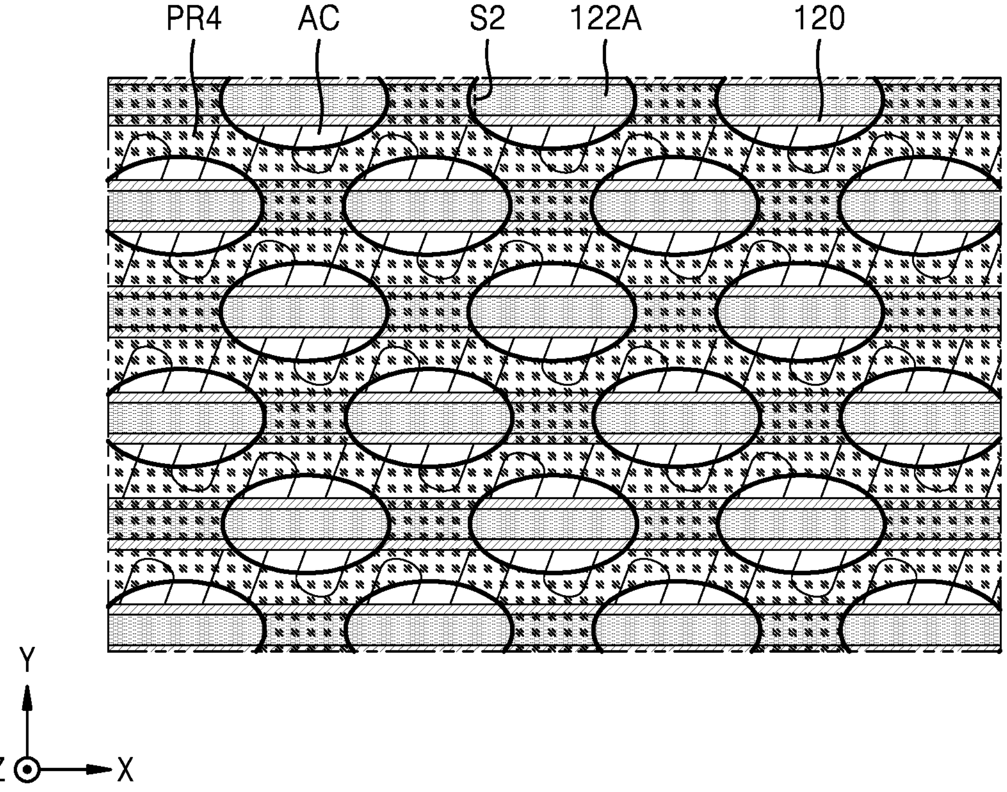
Figure 16B:
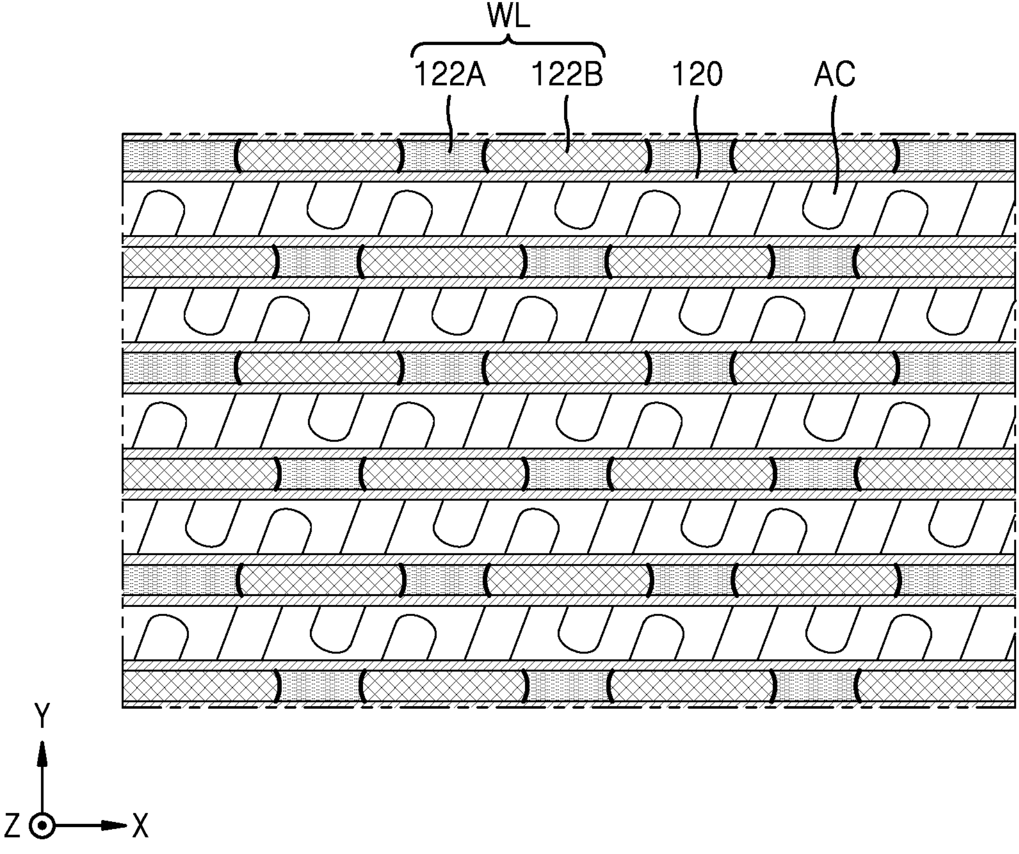

FIG. 16A is a view in which a photoresist is formed on an X-Y plane of the semiconductor device 100 according to some embodiments, and FIG. 16B is a view in which the first gate electrode 122A is etched and the second gate electrode 122B is formed according to FIG. 16A. Referring to FIG. 16A, a plurality of fourth photoresists PR4 may be formed on the X-Y plane of the semiconductor device 100. A region of the first gate electrode 122A to be etched in the word line upper region UWL may vary in accordance with a formation position of the fourth photoresist PR4 (refer to FIG. 16B). In some embodiments, the fourth photoresist PR4 may include an extreme ultraviolet (EUV) photoresist.

Referring to FIG. 16B, the word line upper region UWL may be etched back except for a portion overlapping the fourth photoresist PR4 in the vertical direction (e.g., the Z direction). When the fourth photoresist PR4 is used, the space S2 (refer to FIG. 16A) is generated, and the word line upper region UWL overlapping the second space S2 in the vertical direction (e.g., the Z direction) may be etched back. The first gate electrode 122A may be etched back and the second gate electrode 122B may be formed in the word line upper region UWL overlapping the second space S2 in the vertical direction (e.g., the Z direction). In addition, compared to the embodiment of FIG. 14A, in the word line upper region UWL, the area of the second gate electrode 122B may be reduced and the area of the first gate electrode 122A may be increased.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," "higher" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

In one example, when a certain embodiment may be implemented differently, processes or methods may occur in a sequence different from that specified in the description herein. For example, two consecutive processes may actually be executed at the same time. Depending on a related function or operation, the processes may be executed in a reverse sequence. Moreover, a process may be separated into multiple processes and/or may be at least partially integrated.

In descriptions of temporal relationships, for example, temporal precedent relationships between two events such as "after", "subsequent to", "before", etc., another event may occur therebetween unless "directly after", "directly subsequent" or "directly before" is not indicated.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

While the inventive concept has been particularly shown and described with reference to embodiments thereof, it will be understood that various changes in form and details may be made therein without departing from the spirit and scope of the following claims.

What is claimed is:

1. A semiconductor device comprising:

a substrate including a word line trench extending in a first horizontal direction;

a gate dielectric layer in the word line trench;

a word line extending in the first horizontal direction and in a lower portion of the word line trench on the gate dielectric layer;

an insulation capping layer extending in the first horizontal direction and in an upper portion of the word line trench on the word line; and a plurality of gate electrodes on the substrate, wherein the word line comprises:

a word line lower region extending in the first horizontal direction and including a first gate electrode of the plurality of gate electrodes on the gate dielectric layer; and a word line upper region extending in the first horizontal direction on the word line lower region and including a plurality of second gate electrodes of the plurality of gate electrodes and the first gate electrode of the plurality of gate electrodes.

2. The semiconductor device of claim 1, wherein the first gate electrode has a first work function that is greater than a second work function of the plurality of second gate electrodes.

3. The semiconductor device of claim 2, wherein, in the word line upper region, the first gate electrode and the plurality of second gate electrodes overlap each other in the first horizontal direction.

4. The semiconductor device of claim 2, wherein the substrate comprises a plurality of active regions, wherein one of the plurality of active regions is adjacent to a device isolation layer, and wherein the plurality of second gate electrodes overlaps the plurality of active regions in a vertical direction that is perpendicular to the first horizontal direction.

5. The semiconductor device of claim 4, wherein the first gate electrode in the word line upper region overlaps the device isolation layer in the vertical direction.

6. The semiconductor device of claim 5, wherein the word line trench comprises a first horizontal region and a second horizontal region that has a second width that is greater than a first width of the first horizontal region in the first horizontal direction, and wherein the first gate electrode in the word line upper region overlaps the second horizontal region in the vertical direction.

7. The semiconductor device of claim 6, wherein the plurality of second gate electrodes overlaps the first horizontal region in the vertical direction.

8. The semiconductor device of claim 2, wherein a top surface of the plurality of second gate electrodes contacts the insulation capping layer, and bottom and side surfaces of the plurality of second gate electrodes contact the first gate electrode.

9. The semiconductor device of claim 2, wherein the first gate electrode comprises a metal, a metal nitride, a metal carbide, and/or a combination thereof, and wherein the plurality of second gate electrodes comprises polysilicon.

10. A semiconductor device comprising:

a substrate including a plurality of active regions;

a device isolation layer that is adjacent to one of the plurality of active regions;

a word line trench extending in a first horizontal direction across the plurality of active regions;

a gate dielectric layer that is in the word line trench and in contact with the plurality of active regions and the device isolation layer;

a word line extending in the first horizontal direction and disposed on the gate dielectric layer in a lower portion of the word line trench; and an insulation capping layer extending in the first horizontal direction and disposed in an upper portion of the word line trench on the word line, wherein the word line comprises:

a word line lower region extending in the first horizontal direction and including a first gate electrode on the gate dielectric layer; and a word line upper region including the first gate electrode and a second gate electrode having a second work function less than a first work function of the first gate electrode, and extending in the first horizontal direction on the word line lower region, and wherein the second gate electrode overlaps the plurality of active regions in a vertical direction that is perpendicular to the first horizontal direction.

11. The semiconductor device of claim 10, wherein, in the word line upper region, the first gate electrode and the second gate electrode overlap each other in the first horizontal direction.

12. The semiconductor device of claim 10, wherein the first gate electrode in the word line upper region overlaps the device isolation layer in the vertical direction.

13. The semiconductor device of claim 10, wherein the word line trench comprises a first horizontal region and a second horizontal region that has a second width that is greater than a first width of the first horizontal region in the first horizontal direction, and wherein the first gate electrode in the word line upper region overlaps the second horizontal region in the vertical direction.

14. The semiconductor device of claim 13, wherein the second gate electrode overlaps the first horizontal region in the vertical direction.

15. The semiconductor device of claim 10, wherein a top surface of the second gate electrode contacts the insulation capping layer, and bottom and side surfaces of the second gate electrode contact the first gate electrode.

16. The semiconductor device of claim 10, wherein the first gate electrode comprises a metal, a metal nitride, a metal carbide, and/or a combination thereof, and wherein the second gate electrode comprises polysilicon.

17. A semiconductor device comprising:

a substrate including a word line trench extending in a first horizontal direction;

a gate dielectric layer in the word line trench;

a word line extending in the first horizontal direction and in a lower portion of the word line trench on the gate dielectric layer;

an insulation capping layer extending in the first horizontal direction and in an upper portion of the word line trench on the word line; and a plurality of gate electrodes on the substrate, wherein the word line comprises:

a word line lower region extending in the first horizontal direction and including a first gate electrode of the plurality of gate electrodes on the gate dielectric layer; and a word line upper region extending in the first horizontal direction on the word line lower region and including a plurality of second gate electrodes of the plurality of gate electrodes and the first gate electrode of the plurality of gate electrodes, and wherein a portion of the first gate electrode extends through the plurality of second gate electrodes in a vertical direction that is perpendicular to the first horizontal direction.

18. The semiconductor device of claim 17, wherein the substrate comprises a plurality of active regions, wherein one of the plurality of active regions is adjacent to a device isolation layer, and wherein the portion of the first gate electrode overlaps the device isolation layer in the vertical direction.

19. The semiconductor device of claim 18, wherein the plurality of second gate electrodes overlaps the plurality of active regions in the vertical direction.

20. The semiconductor device of claim 19, wherein the first gate electrode comprises a metal, a metal nitride, a metal carbide, and/or a combination thereof, and wherein the plurality of second gate electrodes comprises polysilicon.

* * * * *